United States Patent
Derkits, Jr. et al.

(10) Patent No.: US 6,222,863 B1
(45) Date of Patent: Apr. 24, 2001

(54) ARTICLE COMPRISING A STABLE, LOW-RESISTANCE OHMIC CONTACT

(75) Inventors: Gustav Edward Derkits, Jr., New Providence, NJ (US); Marlin Wilbert Focht, Easton; Daniel Paul Wilt, Orefield, both of PA (US); Robert Frank Karlicek, Jr., Flemington, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/017,103

(22) Filed: Jan. 31, 1998

(51) Int. Cl.[7] ....................................................... H01S 3/18
(52) U.S. Cl. ............................... 372/43; 372/44; 372/50; 257/741; 257/745; 257/747; 257/750
(58) Field of Search ..................................... 257/741, 745, 257/747, 750; 372/43, 44, 50

(56) References Cited

U.S. PATENT DOCUMENTS

| | | | |
|---|---|---|---|
| 4,374,012 | * | 2/1983 | Alderstein ...................... 204/192.25 |
| 5,260,603 | * | 11/1993 | Kamura et al. ...................... 257/745 |
| 5,523,623 | * | 6/1996 | Yanagihara et al. ................. 257/745 |

OTHER PUBLICATIONS

Okada et al., "Electrical Characteristics and Reliability of Pt / Ti / Pt / Au Ohmic Contacts to p–Type GaAs," v.30, n.4A Jpn. J. App. Phys., pp. L558–L560 (Apr. 1991).

Sugiyama et al., "Ultra–Low Resistance Base Ohmic Contact with Pt / Ti / Pt / Au for High–$f_{max}$ AlGaAs / GaAs Heterojunction Bipolar Transistors," v.33, Part 1, n. 1B, pp. 786–789 (Jan. 1994).

* cited by examiner

Primary Examiner—Hemang Sanghavi
Assistant Examiner—Benjamin Cushwa
(74) Attorney, Agent, or Firm—DeMont & Breyer; Wayne S. Breyer; Jason Paul DeMont

(57) ABSTRACT

A stable, reliable ohmic contact, and improved semiconductor articles and opto-electronic circuits incorporating same, are disclosed. According to an illustrative embodiment of the invention, an ohmic contact having a plurality of thermodynamically-stable layers and layer interfaces is formed by providing a structure comprising multiple, appropriately-thick and specifically-organized layers of suitably-selected material, and exposing the structure to heat to cause reaction to take place between the various layers. Due to the thermodynamic stability of the resulting reacted layers and the interfaces between such layers, there is substantially no tendency for further reaction to occur within the ohmic contact.

14 Claims, 1 Drawing Sheet

ARTICLE COMPRISING A STABLE, LOW-RESISTANCE OHMIC CONTACT

FIELD OF THE INVENTION

The present invention relates to semiconductor devices. More particularly, the present invention relates to a stable, reliable contact for use in electronic and opto-electronic devices and circuits.

BACKGROUND OF THE INVENTION

Most semiconductor devices require an electrical contact for receiving electrical charge. Such a contact typically includes an upper "bonding" layer of metal that is in electrical connection with a wire that delivers the electrical charge. The bonding layer is also in electrical connection with a "cap" layer of the semiconductor device. The cap layer is formed from semiconductor material, and is in electrical contact with underlying semiconductor device layers. In that manner, electrical charge is delivered to the semiconductor device.

The electrical contact creates a metal (bonding layer)/semiconductor (cap layer) interface. The contact is identified as "ohmic" when electrical charge (i.e., electrons) is free to move across the metal-semiconductor interface.

Semiconductor device performance and reliability depend, in large part, on the "quality" of the interface or contact. Instability in prior art ohmic contacts (actually, in the metal layers serving as the contact to the semiconductor materials) has been associated with semiconductor device degradation. Such instability is caused, at least in part, by the tendency of the various layers of the ohmic contact to chemically react, over time, with one another.

A need therefore exists for an improved ohmic contact having substantially no tendency for continued reaction after the contact is formed.

SUMMARY OF THE INVENTION

A highly-stable ohmic contact, and improved semiconductor articles and opto-electronic circuits incorporating same, are disclosed. An ohmic contact in accordance with an illustrative embodiment of the invention comprises a plurality of thermodynamically-stable layers and layer interfaces. In an illustrative embodiment of the inventive method, those layers and layer interfaces are formed by providing a structure comprising multiple, appropriately-thick and specifically-organized layers of suitably-selected material, and exposing the structure to heat to cause reactions to take place between the various layers. Due to the thermodynamic stability of the resulting reacted layers and the interfaces between such layers, there is substantially no tendency for further reaction to occur within the ohmic contact.

In some embodiments, opto-electronic devices, such as lasers, advantageously incorporate the present ohmic contact. Moreover, in other embodiments, semiconductor devices requiring precise control of zinc diffusion advantageously incorporate the present ohmic contact. Regarding the latter application, it has been found that diffusion of the ubiquitous p-dopant zinc in, for example, a capped mesa buried heterostructure laser, occurs primarily during growth of the laser's cap layer. Minimizing cap layer thickness, down to about 1000 angstroms, minimizes zinc diffusion. Due to its reaction-limiting stability, the present ohmic contact enables use of such thin cap layers.

DETAILED DESCRIPTION

Figure 1:
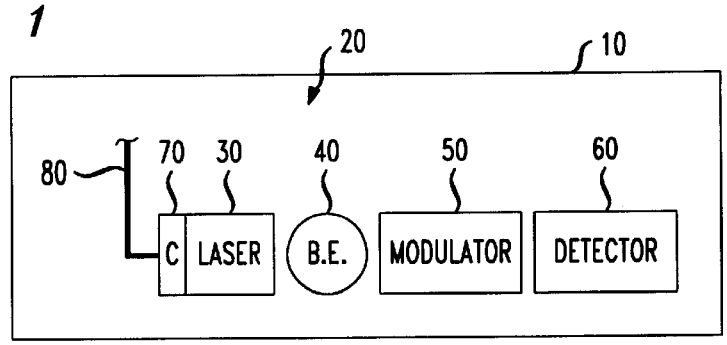
FIG. 1 depicts a simplified schematic of an opto-electronic circuit suitable for incorporating an ohmic contact in accordance with an illustrative embodiment of the present invention.

FIG. 1 depicts a simplified schematic of illustrative opto-electronic circuit 20 incorporating ohmic contact 70 in accordance with an illustrative embodiment of the present invention. The opto-electronic circuit 20 comprises semiconductor laser 30, beam expander 40, modulator 50 and detector 60. Ohmic contact 70 is in electrical communication with semiconductor layers of the laser (not shown), as well as with wire 80 carrying electrical charge. Ohmic contact 70 receives the electrical charge from wire 80 and delivers it to the laser, which emits a beam of light. The beam of light, not shown, is expanded in beam expander 40. The expanded light beam is received by modulator 50, and modulated. A portion of the modulated beam is received by detector 60. The opto-electronic circuit 20 is formed on a chip or wafer 10. The illustrative opto-electronic circuit depicted in FIG. 1 is an electrooptic modulated laser.

An ohmic contact in accordance with illustrated embodiments of the present invention is used to particular advantage in devices requiring careful control over dopant diffusion with respect to active layers (e.g., quantum-well layers) wherein such diffusion occurs during the growth of a heavily-doped "cap" layer of such devices. One such device is a capped mesa buried heterostructure laser. A laser in accordance with an illustrative embodiment that incorporates the present ohmic contact is described in more detail later herein.

Figure 2:
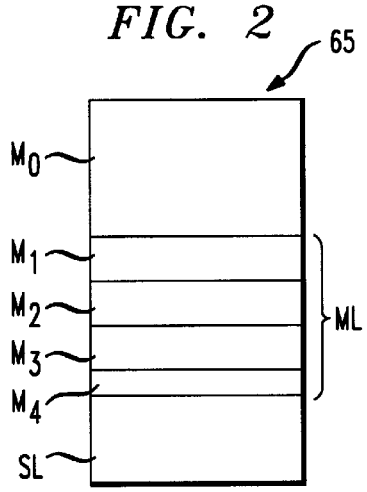
FIG. 2 depicts a structure suitable for forming a highly-stable ohmic contact in accordance with an illustrative embodiment of the present invention.

FIG. 2 depicts an illustrative embodiment of layered structure 65 suitable for forming the present ohmic contact. Layered structure 65 is a "precursor" of the present ohmic contact. Layered structure 65 advantageously includes bonding/current distribution layer $M_0$, which may be a metal, such as gold, or less frequently, palladium or silver. Additional metals (not shown) may be included on the layer $M_o$ for reasons unrelated to the present invention See, U.S. Pat. No. 5,559,817, incorporated by reference herein. Additionally, layered structure 65 advantageously includes semiconductor layer SL, which is comprised of a compound semiconductor. As will be appreciated by those skilled in the art, the bonding/current distribution layer $M_0$ and the semiconductor layer SL are, of course, present in any ohmic contact for a semiconductor device.

Figure 4:
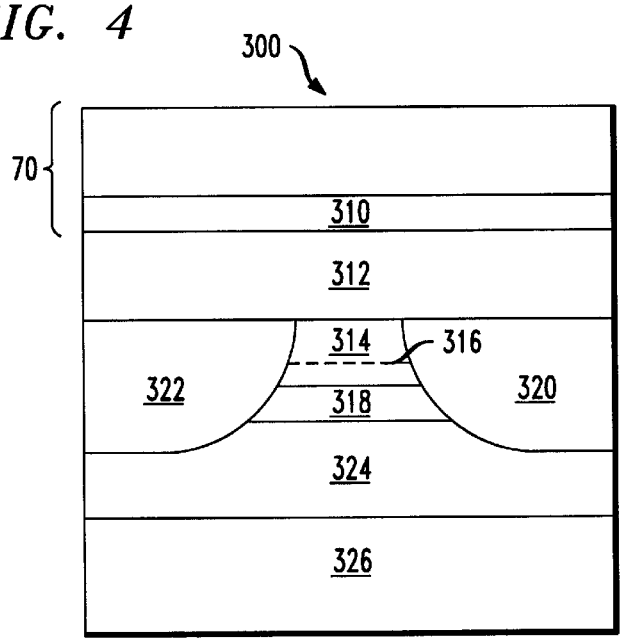
FIG. 4 shows an exemplary embodiment of a semiconductor device incorporating an ohmic contact in accordance with an illustrative embodiment of the present invention.

It will be understood to those skilled in the art that the semiconductor layer SL is also the "cap" or "contact facilitation" layer of a semiconductor device (See FIG. 4). As used herein, "ohmic contact" is defined to include the semiconductor layer SL (the cap layer). It should be appreciated that those skilled in the art might alternatively choose to define an "ohmic contact" as excluding the cap layer. In such a case, the "ohmic contact" abuts the cap layer. It should be understood that, as to the latter alternative definition, an ohmic contact abutting a cap layer is equivalent to an ohmic contact that includes the cap layer. As such, an ohmic contact abutting a cap layer is within the anticipated scope of the appended claims.

It is known in the art that placing one or more materials between the bonding layer $M_0$ and the semiconductor layer SL may improve semiconductor device reliability and performance. Among any other benefits, appropriate selection of such "sandwiched" materials aids in decreasing the tendency for the bonding layer $M_0$ and the semiconductor layer SL to react. Such reaction may result in the degradation of the associated semiconductor device. Thus, an ohmic contact in accordance with the illustrated embodiment of the present invention further includes a multi-layer ML, sandwiched between the bonding layer $M_0$ and the semiconductor layer SL. While it is known in the art to use such sandwiched layers, the specific composition, thickness and arrangement of layers described herein advantageously results in an ohmic contact possessing a hitherto unachieved degree of thermodynamic stability. As such, once formed, there is substantially no driving force for continued reaction between the various layers of the ohmic contact. Improved optoelectronic devices and circuits incorporating the present ohmic contact exhibit improved performance and reliability as a result of the contact's stability.

In the illustrative embodiments described below, the semiconductor layer SL of the contact is formed from a compound semiconductor comprising an element selected from Group III and an element selected from Group V of the periodic table. Such a group III/group V-based compound semiconductor, which is used for forming many types of opto-electronic devices, will be referred to herein as a "III·V semiconductor" or a "III·V compound semiconductor" or simply by the representative numerals "III·V".

In some embodiments, the semiconductor layer SL includes at least one additional element chosen from Group III and/or Group V. Contacts having a semiconductor layer SL that includes three or more elements are referred to herein as "compound" contacts. Illustrative compound contacts include those having a semiconductor layer SL comprised of, for example, III·III'·V, III·V·V' and III·III'·V·V' compound semiconductors, wherein the "prime" indicates a second element from the indicated group.

As described in more detail later in this specification, some of the layers comprising the structure 65 react with other layers within that structure forming a "reacted multilayer" upon exposure to heat As a result of (i) appropriately selecting materials for forming the constituent layers of the multilayer ML, (ii) appropriately positioning the constituent layers relative to one another within the multilayer ML, and (iii) appropriately forming the layers of the multilayer ML to achieve a particular thickness, in accordance with the present teachings, a thermodynamically-stable reacted multilayer advantageously results. In view of such thermodynamic stability, there is substantially no tendency for further reaction among the layers. Moreover, the interfaces between the various layers within the reacted multilayer are thermodynamically stable, such that there is no driving force for any significant amount of diffusion of material across the interfaces. A very stable contact thereby results.

Additionally, the constituent layers of the multi-layer ML are comprised of materials that are selected so that the resulting ohmic contact has very low contact resistance $R_c$ and may be manufactured using standard fabrication processes. Furthermore, the materials comprising the layers should be readily-available and of extremely high purity.

Henceforth, an identifier "$M_i$" will be used to refer to the constituent layers of the multi-layer. More particularly, "M" is used to refer to either a layer of the multilayer or material comprising a layer of the multilayer. The subscripted variable "i" is used to identify a particular one of the constituent layers of the multilayer ML.

In one embodiment, the multilayer ML comprises four layers $M_1$, $M_2$, $M_3$, $M_4$ of material. In accordance with an illustrative embodiment of the present invention, the layers $M_1$ and $M_2$ have differing electronegativities. Specifically, $M_1$ is highly electronegative. For example, $M_1$ may be suitably selected, without limitation, from the "platinum group" metals (i.e., platinum, palladium, rhodium and the like). On the other hand, $M_2$ is weakly electronegative, so that it will form a strong $M_1/M_2$ bond. Weakly-electronegative elements include, among others, metals such as titanium, hafium, zirconium, scandium, lanthanum and cerium.

The layer $M_4$ is comprised of a highly-electronegative element (assuming that the semiconductor layer SL is P++doped, such as by a zinc dopant). Such high-electronegativity promotes absorption of the weakly-electronegative group III element atoms from the semiconductor layer SL during a first bond-formation phase:

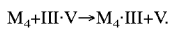

$$M_4 + III \cdot V \rightarrow M_4 \cdot III + V. \qquad [1]$$

On the other hand, $M_3$ is weakly electronegative so that it is capable of forming a strong bond with the highly-electronegative group V atoms during a second bond-formation phase:

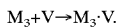

$$M_3 + V \rightarrow M_3 \cdot V. \qquad [2]$$

The bond forming reactions are promoted by exposing structure 65 to a temperature in the range of about 200° C. to about 400° C. for a time period in the range of about 30 seconds to 10 minutes.

It has been discovered that if the layer $M_4$ is very thin, it reacts completely with group III atoms and results in low penetration of the group III and group V atoms into the non-semiconductor layers of the ohmic contact. Such low penetration is attributed to the fact that after such complete reaction into thermodynamically-stable layers, there is substantially no driving force (other than entropy) for continued diffusion of semiconductor atoms. Furthermore, the very thin $M_4$ layer, and resulting $M_4 \cdot III$ layer (after reaction), allows free group V atoms to readily diffuse to, and react with, the adjacent layer $M_3$. Since the layer $M_3$ is thicker than the layer $M_4$, only a portion of the $M_3$ reacts (since, relative to the amount of $M_3$, a substoichiometric amount of group V atoms are released during the formation of $M_4 \cdot III$ and is available for reaction with $M_3$). The $M_3$ and $M_4$ layers are comprised of respective weakly- and strongly-electronegative elements, such as those previously listed.

Figure 3:
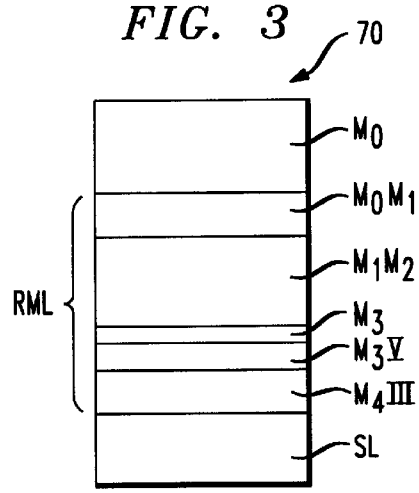
FIG. 3 depicts an illustrative embodiment of a highly-stable ohmic contact formed from the structure of FIG. 2.

After the constituent layers of the multi-layer ML have a reacted to form a reacted multi-layer RML, ohmic contact 70 results (FIG. 3).

The layer (and compound) $M_1 \cdot M_2$ resulting from the reaction of the $M_1$ & $M_2$ is very strongly bonded. More particularly, the absolute value of the heat of formation of $M_1 \cdot M_2$ is much greater than the absolute value of the heat of formation of $M_0 \cdot M_1$ or $M_0 \cdot M_2$, and is greater than the absolute value of the heat of formation of $M_3 \cdot M_2$, $M_3 \cdot V$, $M_2 \cdot V$, $M_4 \cdot III$ and $M_2 \cdot III$. The layer $M_1 \cdot M_2$ is therefore very stable. Due to such stability, the layer $M_1 \cdot M_2$ prevents migration of atoms from the bonding layer $M_0$ into the semiconductor layer SL, and migration of the semiconductor atoms from the semiconductor layer SL into the bonding layer $M_0$.

As previously noted, since the layer $M_4$ is thinner than the layer $M_3$, a substoichiometric amount (relative to the amount of $M_3$) of group V atoms is released during the $M_4 \cdot III$ bond formation reaction: $M_4 + III \cdot V \rightarrow M_4 \cdot III + V$. Thus, after available group V atoms react with $M_3$ to form $M_3 \cdot V$, a portion of the original $M_3$ layer remains, as depicted in FIG. 3. In embodiments wherein atoms from the bonding layer migrate into the $M_1$ layer, layer $M_0 \cdot M_1$ is formed, as shown in FIG. 3.

To the extent that the prior art has developed contacts including multi-layer structures having both high and low electronegativity metals, such layers are not arranged, and/or of appropriate thickness, so that both metals (i.e., $M_3$ & $M_4$) take part in the reactions establishing the metallurgical bond with semiconductor atoms. Further chemical reaction may occur in such prior art contacts, which may result in degradation of an associated opto-electronic device.

In one embodiment wherein the semiconductor layer SL is P++III–V, the "as-deposited" multi-layer ML is comprised of the following materials: $M_1$=platinum (Pt); $M_2$=hafnium (Hf); $M_3$=titanium (Ti) and $M_4$=Pt. The resulting ohmic contact has the structure:

$$M_0/M_0 \cdot Pt/Hf \cdot Pt/Ti/Ti \cdot V/Pt \cdot III/III \cdot V(P++) \qquad [3]$$

In another embodiment wherein the contact is a compound contact having a semiconductor layer SL comprised of P++III·III'·V, such as indium·gallium-arsenide:zinc (InGaAs:Zn), an as-deposited multi-layer ML can be comprised of the same elements listed above. The resulting ohmic contact has the structure:

$$M_0/M_0 \cdot Pt/Hf \cdot Pt/Ti/Ti \cdot As/Pt \cdot In \text{ and } Pt \cdot Ga/In \cdot Ga \cdot As:Zn(P++). \qquad [4]$$

In additional embodiments, the layer $M_2$ can be formed of the same highly-electronegative element as the layer $M_1$ (deposited as a single layer "$M_{12}$") as long as there is substantially no penetration of atoms from the bonding layer $M_0$ into the material comprising the layers $M_1$ and $M_2$. The "as-deposited" multi-layer thus has the structure:

$$/M_{12}/M_3/M_4/. \qquad [5]$$

In such an embodiment, the resulting ohmic contact has the structure:

$$M_0/M_{12}/M_{12} \cdot M_3/M_3/M_3 \cdot V/M_4 \cdot III/III \cdot V(P++). \qquad [6]$$

Note that the layer $M_{12} \cdot M_3$ assumes the role played by $M_1 \cdot M_2$ in the previously-described embodiments. The layer $M_{12} \cdot M_3$ is strongly bonded because $M_{12}$ is highly electronegative and $M_3$ is weakly electronegative.

In the above-described additional embodiments, both the layers $M_{12}$ and $M_4$ are formed of a highly-electronegative element, such as a platinum-group element. In fact, the layers $M_{12}$ and $M_4$ can be the formed of the same element, referenced "$M_{124}$". Thus, the as-deposited multi-layer ML can be simplified to:

$$/M_{124}/M_3/M_{124}/. \qquad [7]$$

The resulting ohmic contact has the configuration:

$$M_0/M_{124}/M_{124} \cdot M_3/M_3/M_3 \cdot V/M_{124} \cdot III/III \cdot V(P++). \qquad [8]$$

An illustrative choice of elements for use in such a simplified multi-layer is $M_{124}$=Pt; and $M_3$=Ti(with $M_0$=Au).

The thickness of the various layers comprising the present ohmic contact varies, to some degree, with the semiconductor device into which it is integrated. Ohmic contact layers having thicknesses within the ranges described below have been found to be suitable for use in opto-electronic devices, such as, for example, lasers: $M_0$: about 100 nanometers (nm) to 5 microns ($\mu$m); $M_1$: about 20 nm to 100 nm; $M_2$: about 20 nm to 100 nm; $M_3$: about 20 nm to 100 nm; $M_4$: about 1 nm–15 nm; and SL: about 20 nm to 150 nm. As previously described, for a P++semiconductor, the layer $M_4$ must be thinner than the layer $M_3$.

An illustrative embodiment of opto-electronic device 300 incorporating the present ohmic contact is depicted in FIG. 4. The illustrative device 300 shown in FIG. 4 is a capped mesa buried heterostructure (CMBH) laser. It will be appreciated by those skilled in the art that the structure shown in FIG. 4 is a "generic" representation of a CMBH laser; particular implementations of a CMBH laser may be somewhat at variance with the structure illustrated in FIG. 4.

The generic CMBH laser comprises substrate 326. In some embodiments, the substrate is doped with n-type dopant, e.g., silicon or germanium for InP; silicon or tellurium for GaAs. N-doped layer 324 is disposed on substrate layer 326. Layer 324 is a buffer layer useful for improving crystal quality and reducing device capacitance. The "active" portion of the structure (i.e., multiple quantum wells (MQWs) 318) is disposed on layer 324. EPI-1 cladding layer 314 is disposed on MQWs 318. Layers 314, 318 and 324 are etched into the familiar "mesa" structure and are flanked by current blocking layers 320, 322. P-doped cladding layer 312 is disposed on EPI-1 cladding layer 314. Finally, p-doped "cap" layer 310 is disposed on cladding layer 312. As previously described, cap layer 310 forms the semiconductor layer SL of ohmic contact 70. The ohmic contact 300 incorporates a reacted multi-layer in accordance with the foregoing description.

In one embodiment, substrate 326, as well as layers 324, 322, 320, 314 and 312 are comprised of appropriately-doped InP, and cap layer 310 is InGaAs. Typically, the p-dopant is zinc.

In the CMBH laser, as well as a variety of other opto-electronic devices, penetration or diffusion of zinc must be very carefully controlled. In particular, while specific concentrations of zinc in the range of about $1 \times 10^{18}$ to $1 \times 10^{19}$ atoms/cm$^3$ are required in the cap layer 310, cladding layer 312 and EPI 1 cladding layer 314, up to a zinc front 316, zinc concentration must fall off sharply thereafter. The zinc front must be close to the active region to deliver current thereto, but kept out of the active region because its presence therein decreases laser efficiency.

Historically, it has been very difficult to control zinc diffusion. In particular, while the zinc front can be positioned with accuracy before growing the cap layer 310, it has been found that a significant amount of zinc diffusion occurs during cap layer growth. Such diffusing zinc can disadvantageously enter the active layers. The applicants have found that zinc diffusion is strongly dependent on cap layer thickness. In particular, decreasing cap thickness unexpectedly decreases zinc diffusion in an approximately linear manner up to a minimum cap thickness of about 1000 angstroms.

Until now, such knowledge would have been of limited utility, since prior art ohmic contacts used a relatively thick cap layer in an attempt to minimize contact metal (e.g., gold) penetration into the cap layer and underlying structure. Due to its high degree of thermodynamic stability, the present ohmic contact experiences substantially no such penetration of contact metal or semiconductor, such that a thin cap layer can be utilized.

When the cap layer is grown using metal-organic chemical vapor deposition (MOCVD), diffusion of the zinc front 16 can be expressed as follows:

$$\text{Zinc front} = A + B \cdot [\text{setback}] + C \cdot [\text{cap thickness}] \quad [9]$$

where:

A, B and C are constants (which can have a negative value); and setback is the location of the zinc front immediately after the layer 312 is grown.

The constants A, B and C vary as a function of device specifics and may be extracted from a plot of measured zinc diffusion data obtained for a specific device.

Although specific embodiments of this invention have been shown and described herein, it is to be understood that these embodiments are merely illustrative of the many possible specific arrangements that can be devised in application of the principles of the invention. Numerous and varied other arrangements can be devised in accordance with these principles by those of ordinary skill in the art without departing from the scope and spirit of the invention.

We claim:

1. An ohmic contact comprising:
   a metal bonding layer for receiving an electrical charge;
   a semiconductor layer formed from a compound semiconductor comprising a first weakly-electronegative element and a first strongly-electronegative element;
   a reacted multi-layer disposed between the metal bonding layer and the semiconductor layer, the reacted multi-layer comprising:
      a first substantially thermodynamically-stable layer adjacent to the semiconductor layer, said first layer comprising a material formed from a reaction of said first weakly-electronegative element and a first quantity of a second strongly-electronegative element; and
      a second substantially thermodynamically-stable layer adjacent to the first layer, said second layer comprising a material formed from a reaction of said first strongly-electronegative element and a second quantity of a second weakly-electronegative element.

2. The ohmic contact of claim 1, further comprising:
   a third layer adjacent to the second layer, the third layer comprising a third quantity of the second weakly-electronegative element, wherein, the first quantity of the second strongly-electronegative element is less than the sum of the second and the third quantities of the second weakly-electronegative element; and
   a fourth layer adjacent to the third layer, the fourth layer comprising a material formed from the reaction of one of the second or a third weakly-electronegative element and one of the second or a third strongly-electronegative element.

3. The ohmic contact of claim 2, wherein:
   the second and the third strongly-electronegative elements are individually selected from the group consisting of platinum, palladium, gold, iridium, osmium and rhodium; and
   the second and the third weakly-electronegative elements are individually selected from the group consisting of titanium, hafnium, zirconium, lanthanum, cerium and scandium.

4. The ohmic contact of claim 3, wherein:
   the bonding layer is comprised of gold, and
   the first weakly-electronegative element is selected from group III of the periodic table and the first strongly-electronegative element is selected from group V of the periodic table.

5. An ohmic contact comprising:
   a bonding layer;
   a semiconductor layer comprising a compound having at least one element from Group III and at least one element from Group V of the periodic table; and
   a reacted multi-layer between the bonding layer and the semiconductor layer, the reacted multi-layer comprising a multiplicity of layers of material, the layers comprising:
      a first-reacted layer adjacent to the semiconductor layer and formed from the reaction of a portion of the Group III element and a first layer of a strongly-electronegative element; and
      a second-reacted layer adjacent to the first layer and formed from the reaction of a portion of the Group V element and a portion of a second layer of a weakly-electronegative element; wherein,
   the first layer of the strongly-electronegative element is thinner than the second layer of the weakly-electronegative element.

6. A laser comprising:
   a mesa including a cladding layer and an active region adjacent thereto having multiple quantum wells;
   current blocking layers flanking the mesa to confine current to the mesa;
   a p-doped cladding layer adjacent the cladding layer that is located within the mesa; and
   an ohmic contact adjacent the p-doped cladding layer, the ohmic contact comprising:
      a metal bonding layer;
      a semiconductor layer comprising a compound having at least one element from Group III and at least one element from Group V of the periodic table; and
      a reacted multi-layer between the bonding layer and the semiconductor layer, the reacted multi-layer comprising a multiplicity of layers of material, the layers comprising:
         a first-reacted layer adjacent to the semiconductor layer and formed from the reaction of a portion of the Group III element and a first layer of a strongly-electronegative element; and
         a second-reacted layer adjacent to the first layer and formed from the reaction of a portion of the Group V element and a portion of a second layer of a weakly-electronegative element; wherein,
      the first layer of the strongly electronegative element is thinner than the second layer of the weakly electronegative element.

7. The laser of claim 6, wherein the cladding layer within the mesa, the cladding layer outside the mesa and the current blocking layers are formed from indium-phosphide.

8. The laser of claim 7, wherein the semiconductor layer is formed from indium-gallium-arsenide.

9. The laser of claim 8, wherein
   the bonding layer is gold, the strongly electronegative element is platinum and the weakly electronegative element is titanium; and further wherein
   the first-reacted layer comprises platinum·indium and platinum·gallium, and
   the second-reacted layer comprises titanium·arsenide; the reacted multi-layer further comprising:
      a layer of titanium adjacent the second-reacted multi-layer;

a third-reacted layer comprising platinum·titanium adjacent to the layer of titanium; and a fourth layer of platinum adjacent the third-reacted layer and the bonding layer.

10. The laser of claim 9, wherein the first layer of the strongly-electronegative element has a thickness in the range of about 1 to 15 nanometers and the second layer of the weakly-electronegative element has a thickness in the range of about 20 to 100 nanometers.

11. The laser of claim 10, wherein the semiconductor layer has a thickness of about 20 to about 150 nanometers.

12. The laser of claim 11, wherein the semiconductor layer has a thickness of about 100 nanometers.

13. The laser of claim 6, and further comprising:

a beam expander region in optical communication with the laser;

a modulator region in optical communication with the beam expander region; and a photodetection region in optical communication with the modulator region, the optical communicating regions and the laser collectively comprising an electrooptic modulated laser.

14. A chip including an optoelectronic circuit comprising:

a laser having an ohmic contact adjacent to a p-doped cladding layer, the ohmic contact comprising:

a metallic bonding layer;

a semiconductor layer comprising a compound having at least one element selected from Group III and at least one element selected from Group V of the periodic table; and a reacted multi-layer between the bonding layer and the semiconductor layer, the reacted multi-layer comprising a multiplicity of layers of material, the layers comprising:

a first-reacted layer adjacent to the semiconductor layer and formed from the reaction of a portion of the Group III element and a first layer of a strongly-electronegative element; and a second-reacted layer adjacent to the first layer and formed from the reaction of a portion of the Group V element and a portion of a second layer of a weakly-electronegative element; wherein, the first layer of the strongly electronegative element is thinner than the second layer of the weakly electronegative element; and a diode in optical communication with the laser.

* * * * *